US 9,583,645 B2

(12) United States Patent
Kim et al.

(10) Patent No.: US 9,583,645 B2
(45) Date of Patent: Feb. 28, 2017

(54) PHOTOVOLTAIC SYSTEM

(71) Applicant: LSIS CO., LTD., Anyang-si, Gyeonggi-do (KR)

(72) Inventors: Dong Hyun Kim, Seoul (KR); Jong Kug Seon, Seoul (KR); Jong Bae Kim, Seoul (KR)

(73) Assignee: LSIS CO., LTD., Anyang-si (KR)

( * ) Notice: Subject to any disclaimer, the term of this patent is extended or adjusted under 35 U.S.C. 154(b) by 0 days.

(21) Appl. No.: 14/316,555

(22) Filed: Jun. 26, 2014

(65) Prior Publication Data

US 2015/0013744 A1    Jan. 15, 2015

(30) Foreign Application Priority Data

Jul. 10, 2013 (KR) .................. 10-2013-0081154

(51) Int. Cl.
| H01L 31/02 | (2006.01) |
| G05F 1/67 | (2006.01) |
| H01L 31/042 | (2014.01) |
| G01R 31/40 | (2014.01) |
| H02S 40/32 | (2014.01) |

(52) U.S. Cl.
CPC .......... *H01L 31/02021* (2013.01); *G05F 1/67* (2013.01); *H02S 40/00* (2013.01); *H02S 40/32* (2014.12); *H02S 50/00* (2013.01); *Y02E 10/58* (2013.01)

(58) Field of Classification Search
CPC ........... H02S 40/00; H02S 50/00; H02S 40/32
See application file for complete search history.

(56) References Cited

U.S. PATENT DOCUMENTS

| 2008/0143188 A1* | 6/2008 | Adest et al. ............... 307/82 |
| 2009/0284240 A1 | 11/2009 | Zhang et al. |
| 2011/0001360 A1 | 1/2011 | Rua' et al. |

FOREIGN PATENT DOCUMENTS

| CN | 102012714 | 4/2011 |
| CN | 102084584 | 6/2011 |
| CN | 102362359 | 2/2012 |
| CN | 202197235 | 4/2012 |

(Continued)

OTHER PUBLICATIONS

Korean Intellectual Property Office Application Serial No. 10-2013-0081154, Notice of Allowance dated Oct. 6, 2014, 2 pages.

(Continued)

*Primary Examiner* — Shannon Gardner
(74) *Attorney, Agent, or Firm* — Lee Hong Degerman Kang & Waimey

(57) ABSTRACT

Disclosed is a photovoltaic system including a power optimizer, capable of minimizing noise occurring due to shading, an error in an output power of a photovoltaic module, etc. while a maximum power point tracking (MPPT) algorithm is performed. The photovoltaic system includes a photovoltaic module; a power optimizer; and an inverter, wherein the power optimizer includes: an input unit configured to receive an output power of the photovoltaic module; a sensing unit configured to sense an output voltage and an output current of the photovoltaic module; and a controller configured to control an output of the power optimizer, by comparing the presently-sensed current with a previously-sensed current.

3 Claims, 4 Drawing Sheets

(56) References Cited

FOREIGN PATENT DOCUMENTS

| | | |
|---|---|---|
| CN | 102457066 | 5/2012 |
| CN | 102597902 | 7/2012 |
| CN | 103155349 | 6/2013 |
| EP | 2503426 | 9/2012 |
| JP | 2009-219238 | 9/2009 |
| JP | 2011-107904 | 6/2011 |
| JP | 2011-521362 | 7/2011 |
| JP | 2012-084809 | 4/2012 |
| KR | 10-2009-0127940 | 12/2009 |
| KR | 10-1065862 | 9/2011 |
| KR | 10-1260880 | 5/2013 |
| WO | 2010/087804 | 8/2010 |
| WO | 2011/122165 | 10/2011 |

OTHER PUBLICATIONS

European Patent Office Application Serial No. 14175412.7, Search Report dated Feb. 9, 2015, 10 pages.
Korean Intellectual Property Office Application Serial No. 10-2013-0081154, Office Action dated Jun. 23, 2014, 3 pages.
The State Intellectual Property Office of the People's Republic of China Application Serial No. 201410325884.8, Office Action dated Dec. 30, 2015, 7 pages.
Japan Patent Office Application Serial No. 2014-142266, Office Action dated Jun. 30, 2015, 6 pages.

\* cited by examiner

PHOTOVOLTAIC SYSTEM

CROSS-REFERENCE TO RELATED APPLICATION

Pursuant to 35 U.S.C. §119(a), this application claims the benefit of earlier filing date and right of priority to Korean Application No. 10-2013-0081154, filed on Jul. 10, 2013, the contents of which are all hereby incorporated by reference herein in its entirety.

BACKGROUND OF THE DISCLOSURE

1. Field of the Disclosure

The present disclosure relates to a photovoltaic system, and particularly, to a photovoltaic system including a power optimizer, capable of minimizing noise occurring while a maximum power point tracking (MPPT) algorithm is performed, due to shading, an error in an output power of a photovoltaic module, etc.

2. Background of the Disclosure

Generally, a photovoltaic system includes a plurality of photovoltaic modules connected to each other in series, and an inverter configured to convert a DC voltage output from the plurality of photovoltaic modules into an AC voltage, and configured to output the AC power.

However, the conventional photovoltaic system may have the following problems.

When an output power of one of the plurality of photovoltaic modules is drastically decreased, noise occurs during a process of searching for (tracking) a maximum power of a plurality of photovoltaic modules connected to each other in series. In this case, an inverter positioned at the next stage of the photovoltaic modules may be damaged.

SUMMARY OF THE DISCLOSURE

Therefore, an aspect of the detailed description is to provide a photovoltaic system capable of minimizing noise occurring while a maximum power point tracking (MPPT) algorithm is performed, by bypassing one or more photovoltaic modules among a plurality of photovoltaic modules serially-connected to each other, in a case where the corresponding photovoltaic module has a significant change in the amount of sunshine, i.e., in a case where an output current of the corresponding photovoltaic module is significantly decreased due to wind, rain, dust in the air, shading, etc. For this, a present output current and a previous output current of the corresponding photovoltaic module are compared with each other. Then if a difference between the present output current and the previous output current exceeds a preset reference value, the corresponding photovoltaic module is bypassed.

To achieve these and other advantages and in accordance with the purpose of this specification, as embodied and broadly described herein, there is provided a photovoltaic system, comprising: a photovoltaic module; a power optimizer; and an inverter, wherein the power optimizer includes: an input unit configured to receive an output power of the photovoltaic module; a sensing unit configured to sense an output voltage and an output current of the photovoltaic module; and a controller configured to control an output of the power optimizer, by comparing the presently-sensed current with a previously-sensed current.

In an embodiment of the present invention, the power optimizer may further include: a DC-DC converter configured to lower or boost an input voltage of the power optimizer by a preset reference value, with respect to an output voltage of the power optimizer, while a maximum power point tracking (MPPT) algorithm is performed by the controller; a bypass unit configured to bypass an output of the power optimizer under control of the controller; and a power supply unit configured to supply power to the sensing unit, the controller, the DC-DC converter, and the bypass unit, based on the power received by the input unit.

In an embodiment of the present invention, if a difference between the presently-sensed current and the previously-sensed current exceeds a preset reference value, the controller may stop the MPPT algorithm being currently performed, and operates the bypass unit such that an output of the power optimizer is bypassed in a structure where the photovoltaic modules are serially-connected to each other in a string.

In an embodiment of the present invention, if a difference between the presently-sensed current and the previously-sensed current does not exceed a preset reference value, the controller may search for a maximum power point based on the sensed voltage and current, by performing the MPPT algorithm together with the DC-DC converter, and may determine an output voltage of the power optimizer based on a maximum power corresponding to the searched maximum power point, and based on the sensed current.

In an embodiment of the present invention, if a difference between the presently-sensed current and the previously-sensed current does not exceed a preset reference value, the controller may search for a maximum power point based on the sensed voltage and current, by performing the MPPT algorithm. Then the controller may determine a voltage corresponding to the power received by the input unit as an output voltage of the power optimizer, and may output the determined output voltage.

In an embodiment of the present invention, the bypass unit may include one or more bypass diodes.

According to another aspect of the present invention, there is provided a photovoltaic system, comprising: a plurality of photovoltaic modules implemented in a string, and configured to output a generated power; a power optimizer serially-connected to each of the photovoltaic modules, configured to sense an output voltage and an output current of each of the photovoltaic modules, and to compare the presently-sensed current with a previously-sensed current, to thus control the output voltage; and an inverter configured to convert the output voltage of a DC form into an AC voltage.

In an embodiment of the present invention, if a difference between the presently-sensed current and the previously-sensed current exceeds a preset reference value, the power optimizer may stop the MPPT algorithm, and may operate the bypass unit included therein such that an output of the power optimizer can be bypassed.

In an embodiment of the present invention, if a difference between the presently-sensed current and the previously-sensed current does not exceed a preset reference value, the power optimizer may search for a maximum power point based on the sensed voltage and current, by performing the MPPT algorithm. Then the power optimizer may determine an output voltage thereof, based on a maximum power corresponding to the searched maximum power point, and based on the sensed current, and may output the determined output voltage.

Further scope of applicability of the present application will become more apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the detailed description.

BRIEF DESCRIPTION OF THE DRAWINGS

The accompanying drawings, which are included to provide a further understanding of the disclosure and are incorporated in and constitute a part of this specification, illustrate exemplary embodiments and together with the description serve to explain the principles of the disclosure.

In the drawings.

DETAILED DESCRIPTION OF THE DISCLOSURE

Description will now be given in detail of the exemplary embodiments, with reference to the accompanying drawings. For the sake of brief description with reference to the drawings, the same or equivalent components will be provided with the same reference numbers, and description thereof will not be repeated.

Figure 1:
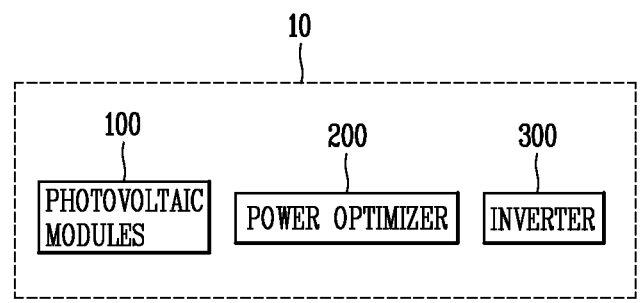
FIG. 1 is a block diagram illustrating a configuration of a photovoltaic system according to the present invention.

FIG. 1 is a block diagram illustrating a configuration of a photovoltaic system 10 according to the present invention.

As shown in FIG. 1, the photovoltaic system 10 includes a photovoltaic module 100, a power optimizer 200 and an inverter 300. However, the present invention is not limited to the components of FIG. 1. That is, the photovoltaic system 10 may include smaller or larger number of components than the components shown in FIG. 1.

The photovoltaic module 100 is formed in plurality, and the plurality of photovoltaic modules 100 are formed in series (or are implemented in a string).

The photovoltaic modules 100 generate electricity from solar light, and transmit the generated electricity to the power optimizer 200 connected thereto.

The photovoltaic modules 100 are implemented as solar cells which include silicon semiconductor devices formed of silicone such as amorphous silicone, microcrystalline silicone, crystalline silicone and mono-crystalline silicone, compound semiconductor devices, etc.

Figure 2:
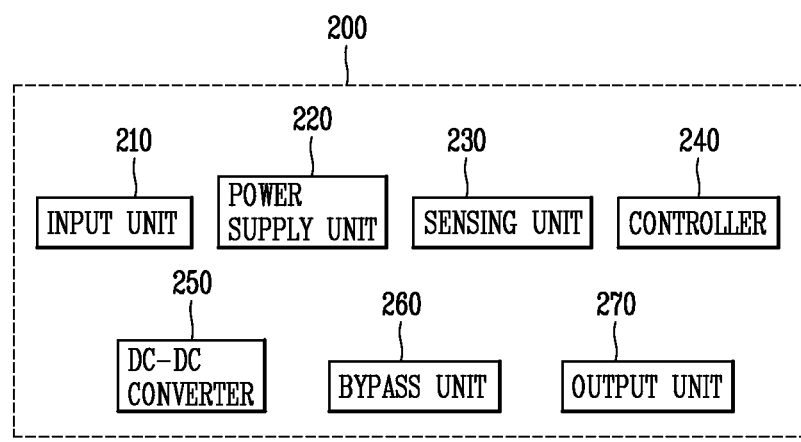
FIG. 2 is a block diagram illustrating a configuration of a power optimizer according to the present invention.

As shown in FIG. 2, the power optimizer 200 is composed of an input unit 210, a power supply unit 220, a sensing unit 230, a controller 240, a DC-DC converter 250, a bypass unit 260 and an output unit 270. However, the present invention is not limited to the components of FIG. 2. That is, the power optimizer 200 may include smaller or larger number of components than the components of FIG. 2.

The input unit 210 receives an output power (or voltage/current) of the photovoltaic module 100.

The input unit 210 includes a device (not shown) for removing noise included in the received power.

The power supply unit 220 converts the voltage received by the input unit 210, into a voltage proper to the components included in the power optimizer 200. Then the power supply unit 220 supplies the converted voltage, to the components included in the power optimizer 200.

The power supply unit 220 is composed of a buck converter, a plurality of semiconductor devices, etc.

The sensing unit (or measuring unit) 230 is operated under control of the controller 240, and is configured to sense (or measure) a current and a voltage input from the photovoltaic module 100.

The controller 240 entirely controls the power optimizer 200.

The controller 240 determines whether a difference between the presently-sensed current and a previously-sensed current exceeds a preset reference value.

That is, the controller 240 checks whether a difference between the presently-sensed current and a previously-sensed current exceeds a preset reference value (e.g., 5 A).

If the difference between the presently-sensed current and the previously-sensed current exceeds the preset reference value, the controller 240 operates the bypass unit 260, thereby bypassing an output power of a corresponding photovoltaic module 100 connected to the power optimizer 200, among the plurality of photovoltaic modules 100 implemented in a string. In this case, the controller 240 may operate the bypass unit 260, thereby bypassing an output power of the power optimizer 200 connected to the corresponding photovoltaic module 100.

More specifically, if the difference between the presently-sensed current and the previously-sensed current exceeds the preset reference value (e.g., 5 A), the controller 240 determines that an output current of the corresponding photovoltaic module 100 has been drastically decreased due to wind, rain, dust in the air, shading, etc. As a result, the controller 240 may operate the bypass unit 260 of the power optimizer 200 connected to the corresponding photovoltaic module 100, or may bypass an output (output power) of the power optimizer 200, for prevention of an output of the corresponding photovoltaic module 100 among the plurality of photovoltaic modules 100 serially-connected to each other.

On the contrary, if the difference between the presently-sensed current and the previously-sensed current does not exceed the preset reference value (e.g., 5 A), the controller 240 periodically increases or decreases the presently-sensed voltage (or output voltage of the photovoltaic module 100) based on the presently-sensed current and voltage. And the controller 240 performs a Maximum Power Point Tracking (MPPT) or a Perturbation and Observation Maximum Power Point Tracking (P&O MPPT) algorithm, through a comparison between a previous output power and a present output power, thereby searching for (tracking) a maximum power point.

Figure 3:
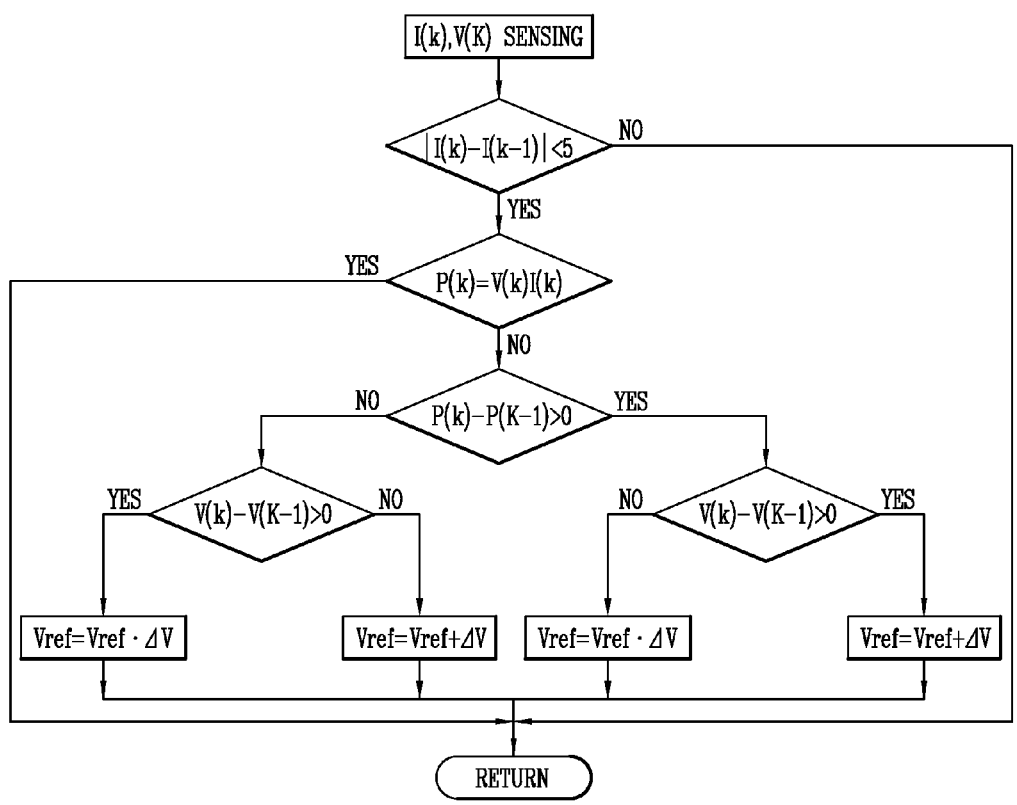
FIG. 3 is a flowchart illustrating processes for performing an MPPT (or P&O MPPT) algorithm according to an embodiment of the present invention.

Processes for performing the MPPT (or P&O MPPT) algorithm by the controller 240 will be explained in more detail with reference to FIG. 3.

If the difference between the presently-sensed current and the previously-sensed current does not exceed the preset reference value (e.g., 5 A), the controller 240 calculates power based on the currently-sensed voltage and current (S310).

Next, in order to determine a voltage reference value with respect to a next measuring time point (k+1), the controller 240 compares present power (e.g., P(k)) with previous power (e.g., P(k−1)), thereby determining whether the present power (P(k)) has been increased or decreased with respect to the previous power (P(k−1)) (S320).

Further, the controller 240 compares a present voltage (e.g., V(k)) with a previous voltage (e.g., V(k−1)), thereby determining whether the present voltage (V(k)) has been increased or decreased with respect to the previous voltage (V(k−1)) (S330, S340).

As a result of the determinations (S320, S330 and S340), if both the present power (P(k)) and the present voltage (V(k)) have been decreased with respect to the previous power (P(k−1)) and the previous voltage (V(k−1)), respectively, a voltage reference value (e.g., Vref) of the photovoltaic module 100 is increased by a preset value (e.g., ΔV) (S350). If the present power has been deceased with respect to the previous power while the present voltage has been increased with respect to the previous voltage, the voltage reference value (e.g., Vref) of the photovoltaic module 100 is decreased by the preset value (e.g., ΔV) (S360). If the present power has been increased with respect to the previous power while the present voltage has been decreased with respect to the previous voltage, the voltage reference value (e.g., Vref) of the photovoltaic module 100 is decreased by the preset value (e.g., ΔV) (S370). If both the present power and the present voltage have been increased with respect to the previous power and the previous voltage, the voltage reference value (e.g., Vref) of the photovoltaic module 100 is increased by the preset value (e.g., ΔV) (S380).

The DC-DC converter 250 compares an input voltage with an output voltage, and is operated in a voltage lowering mode or a boosting mode based on a result of the comparison. The DC-DC converter 250 searches for a maximum power point (or the next voltage reference value) of the photovoltaic module.

If the present power is the same as the previous current, the controller 240 uses the voltage reference value of the photovoltaic module 100 as it is.

The controller 240 determines an output voltage of the power optimizer 200, based on a maximum power corresponding to the searched maximum power point, and based on the sensed current.

Figure 4:
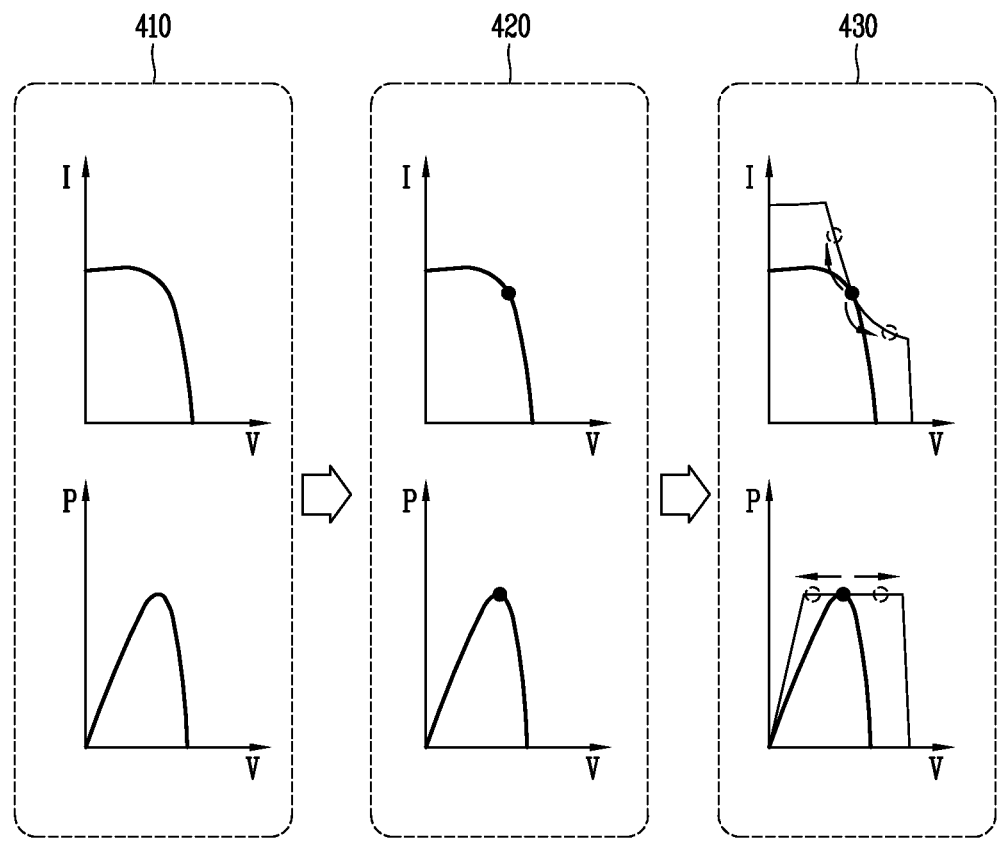
FIG. 4 is a view for explaining an operation of a power optimizer according to an embodiment of the present invention.

More specifically, in a state where an output voltage and an output current of the photovoltaic modules 100 have been sensed as shown in a first graph 410 of FIG. 4, the controller 240 performs the MPPT algorithm as shown in a second graph 420 to thus search for the maximum power point. Then as shown in a third graph 430, the controller 240 determines an output voltage (or voltage reference value) of the power optimizer 200, through an output power and a string current. In this case, the output power is the same as (or similar to) an input power of the power optimizer 200.

The controller 240 transmits (outputs) the determined output voltage of the power optimizer 200, to the inverter 300 through the output unit 270.

The controller 240 searches for (tracks) a maximum power point input of the photovoltaic modules 100, and outputs the power input through the input unit 210 to the output unit 270.

The DC-DC converter 250 lowers or boosts an input voltage of the power optimizer 200 by a prescribed voltage (or preset reference value), with respect to an output voltage of the of the power optimizer 200, while the MPPT algorithm is performed by the controller 240.

The DC-DC converter 250 is composed of a semiconductor device and a capacitor which are for lowering a voltage or boosting.

The bypass unit 260 is operated under control of the controller 240.

The bypass unit 260 includes one or more bypass diodes.

For instance, in a structure where 10 photovoltaic modules 100 are connected to each other in series in a string, if at least one of the 10 photovoltaic modules 100 has a significant change in the amount of sunshine, i.e., wind, rain, dust in the air, shading and so on have occurred, an output current of the specific photovoltaic module 100 is reduced. In this case, an output power of the specific photovoltaic module 100 is also reduced. While such MPPT algorithm is performed with respect to the specific photovoltaic module 100, an error, a malfunction and/or noise occur. This may cause damages to the inverter 300 serving as a load.

Accordingly, if a difference between the presently-sensed current and the previously-sensed current exceeds the preset reference value, the bypass unit 260 stops the MPPT algorithm so that an operation of the rest 9 photovoltaic modules 100 cannot be influenced. At the same time, the bypass unit 260 bypasses an output of the power optimizer 200, thereby minimizing noise occurring from the output unit 270.

The output unit 270 outputs the output voltage (voltage reference value) determined through the controller 240 and the DC-DC converter 250, to the inverter 300.

The output unit 270 is composed of the same components as the input unit 210.

The inverter (photovoltaic inverter) 300 converts a DC voltage received from the power optimizer 200 into an AC voltage, and then provides the AC voltage to a load (not shown).

As aforementioned, if at least one of the plurality of photovoltaic modules has a significant change in the amount of sunshine, i.e., if an output current of at least one of the plurality of photovoltaic modules is significantly decreased due to wind, rain, dust in the air, shading etc, the controller compares a present output current of the corresponding photovoltaic module, with a previous output current of the corresponding photovoltaic module. If a difference between the two currents exceeds a preset reference value, the controller may bypass the corresponding photovoltaic module.

Hereinafter, a method for controlling a photovoltaic system according to the present invention will be explained in more detail with reference to FIGS. 1 to 5.

Figure 5:
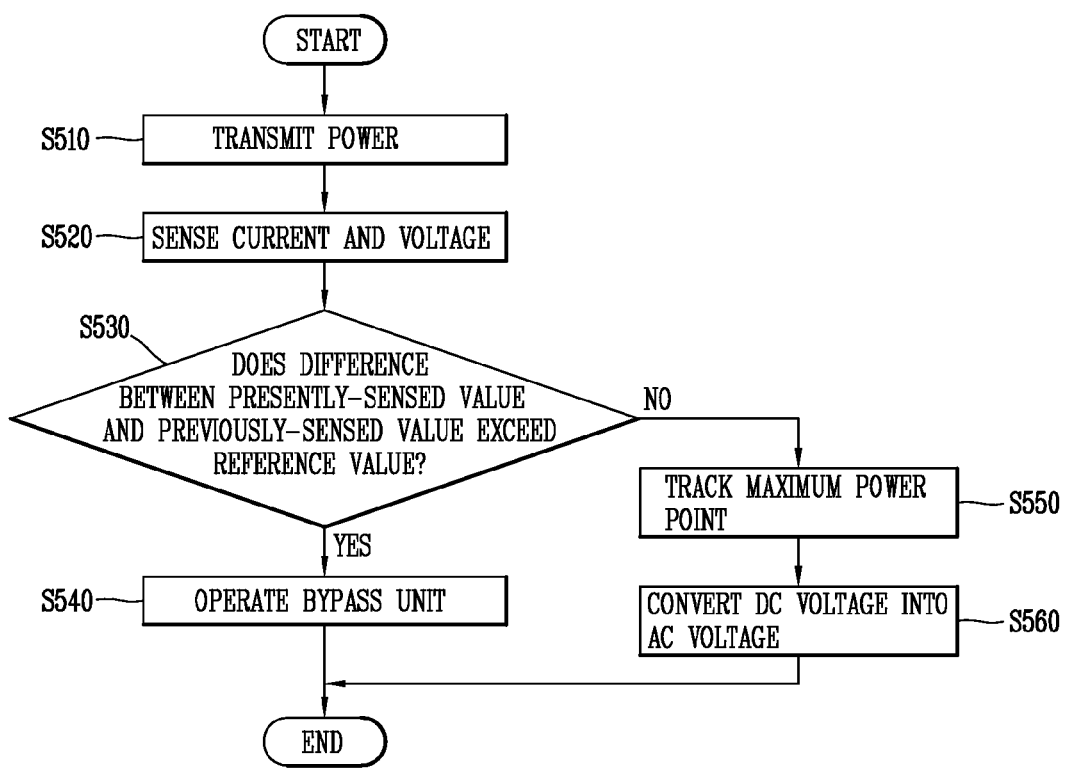
FIG. 5 is a flowchart illustrating a method for controlling a photovoltaic system according to an embodiment of the present invention.

FIG. 5 is a flowchart illustrating a method for controlling a photovoltaic system according to an embodiment of the present invention.

Firstly, a plurality of photovoltaic modules 100 connected to each other in series transmit generated power (or current/voltage) to a power optimizer 200 connected thereto (S510).

The power optimizer 200 is operated by the current and the voltage received from the photovoltaic module, and sensing (measuring) the current and the voltage (S520).

Then the power optimizer 200 determines whether a difference between the presently-sensed current and a previously-sensed current exceeds a preset reference value (S530).

For instance, the power optimizer 200 determines whether a difference between the presently-sensed current and a previously-sensed current exceeds a preset reference value (e.g., 5 A).

If the difference between the presently-sensed current and the previously-sensed current exceeds the preset reference value, the power optimizer 200 operates a bypass unit 260 included therein, thereby bypassing an output power of the photovoltaic module 100 connected to the power optimizer 200, among the plurality of photovoltaic modules 100 implemented in a string. In this case, the power optimizer 200 may operate the bypass unit 260, thereby bypassing an output power of the power optimizer 200 connected to the corresponding photovoltaic module 100.

For instance, if the difference between the presently-sensed current (e.g., 2 A) and the previously-sensed current (e.g., 8 A) exceeds the preset reference value (e.g., 5 A), the power optimizer 200 determines that an output current of the corresponding photovoltaic module 100 has been drastically decreased due to wind, rain, dust in the air, shading, etc. For prevention of an output of the corresponding photovoltaic module 100 among the plurality of photovoltaic modules 100 serially-connected to each other, the power optimizer 200 connected to the corresponding photovoltaic module 100 operates its bypass unit 260, the bypass unit 260 connected to the corresponding photovoltaic module 100. As a result, the power optimizer 200 bypasses an output (output power) of the power optimizer 200 (S540).

If a difference between the presently-sensed current and the previously-sensed current does not exceed the preset reference value, the power optimizer 200 periodically increases or decreases the sensed voltage, based on the sensed current. The power optimizer 200 searches for a maximum power point, by performing an MPPT (or P&O MPPT) algorithm.

The power optimizer 200 determines an output voltage thereof, based on a maximum power corresponding to the searched maximum power point, and based on the sensed current.

The power optimizer 200 transmits the determined output voltage thereof to the inverter 300 (S550).

Then the inverter 300 converts a DC voltage received from the power optimizer 200 into an AC voltage, and then provides the AC voltage to a load (not shown) (S560).

As aforementioned, the photovoltaic system of the present invention can minimize noise occurring while a maximum power point tracking (MPPT) algorithm is performed, by bypassing one or more photovoltaic modules among a plurality of photovoltaic modules serially-connected to each other, in a case where the corresponding photovoltaic module has a significant change in the amount of sunshine, i.e., in a case where an output current of the corresponding photovoltaic module is significantly decreased due to wind, rain, dust in the air, shading, etc. For this, a present output current and a previous output current of the corresponding photovoltaic module are compared with each other. Then if a difference between the present output current and the previous output current exceeds a preset reference value, the corresponding photovoltaic module is bypassed.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. A photovoltaic system, comprising:
a plurality of photovoltaic modules serially connected and being configured to generate power from solar light;
a power optimizer coupled to the plurality of photovoltaic module to receive the generated power as an input power and to provide an output power, the power optimizer comprising:
an input unit coupled to the plurality of photovoltaic modules to receive the generated power;
a sensing unit configured to sense voltage and current of the power generated by the plurality of photovoltaic modules;
a DC-DC converter configured to lower or boost a voltage of the input power of the power optimizer by a preset reference value, with respect to a voltage of the output power of the power optimizer;
a bypass unit;
a controller configured to:
execute a maximum power point tracking (MPPT) algorithm;
stop executing the MPPT algorithm and operate the bypass unit to bypass the output power of the power optimizer when a difference between presently-sensed current sensed by the sensing unit and previously-sensed current sensed by the sensing unit exceeds a preset reference value;
search for a maximum power point based on the voltage and the current sensed by the sensing unit by executing the MPPT algorithm when a difference between the presently-sensed current and the previously-sensed current does not exceed a preset reference value;
determine the output voltage of the output power of the power optimizer based on a maximum power corresponding to the searched maximum power point;
an inverter coupled to the DC-DC converter to convert DC voltage received from the DC-DC converter to AC voltage to provide to a load; and
a power supply unit configured to supply power to the sensing unit, the controller, the DC-DC converter, and the bypass unit, based on the generated power received by the input unit.

2. The photovoltaic system of claim 1, wherein the controller is further configured to:
determine the output voltage of the output power of the power optimizer based on the generated power received by the input unit when the difference between the presently-sensed current and the previously-sensed current does exceed the preset reference value.

3. The photovoltaic system of claim 1, wherein the bypass unit includes one or more bypass diodes.

* * * * *